United States Patent
Lee et al.

(10) Patent No.: US 9,112,176 B2
(45) Date of Patent: Aug. 18, 2015

(54) ORGANIC LIGHT EMITTING DISPLAY DEVICE AND REWORKING METHOD THEREOF

(71) Applicant: LG DISPLAY CO., LTD., Seoul (KR)

(72) Inventors: Mi Jung Lee, Gyeonggi-do (KR); Juhn Suk Yoo, Gyeonggi-do (KR); Jong Moo Kim, Seoul (KR)

(73) Assignee: LG Display Co., Ltd., Seoul (KR)

(*) Notice: Subject to any disclaimer, the term of this patent is extended or adjusted under 35 U.S.C. 154(b) by 0 days.

(21) Appl. No.: 13/719,781

(22) Filed: Dec. 19, 2012

(65) Prior Publication Data
US 2013/0270528 A1  Oct. 17, 2013

(30) Foreign Application Priority Data

Apr. 16, 2012 (KR) .......................... 10-2012-039104

(51) Int. Cl.
*H01L 51/52* (2006.01)
*H01L 51/00* (2006.01)
*H01L 27/32* (2006.01)
*H05K 1/11* (2006.01)
*H05K 3/22* (2006.01)
*H05K 3/36* (2006.01)

(52) U.S. Cl.
CPC ............ *H01L 51/52* (2013.01); *H01L 27/3223* (2013.01); *H01L 27/3276* (2013.01); *H01L 51/0031* (2013.01); *H05K 1/117* (2013.01); *H05K 3/225* (2013.01); *H05K 3/361* (2013.01); *H05K 2201/0979* (2013.01); *H05K 2201/09781* (2013.01); *H05K 2203/176* (2013.01)

(58) Field of Classification Search
CPC ...................................................... H01L 51/52
See application file for complete search history.

(56) References Cited

U.S. PATENT DOCUMENTS

2005/0139841 A1   6/2005  Park
2007/0007670 A1   1/2007  Chen
(Continued)

FOREIGN PATENT DOCUMENTS

CN    1638540 A    7/2005
CN    101071231 A  11/2007
(Continued)

OTHER PUBLICATIONS

Office Action dated Apr. 3, 2015 from the State Intellectual Property Office of the People's Republic of China in counterpart Chinese application No. 201210574417.X.

*Primary Examiner* — Fernando L Toledo
*Assistant Examiner* — Valerie N Newton
(74) *Attorney, Agent, or Firm* — Morgan, Lewis & Bockius LLP

(57) ABSTRACT

An organic light emitting display device is disclosed. The organic light emitting display device includes: an organic light emitting display panel defined into a display area for displaying an image and a non-display area surrounding the display area; a chip-on-film loaded with a driver IC chip, which is configured to drive the organic light emitting display panel, and attached to a pad portion which is formed on the non-display area of the organic light emitting display panel; and a printed circuit board configured to apply signals to the driver IC chip and attached to one edge of the chip-on-film, wherein the organic light emitting display panel includes a dummy pad portion which is formed on the non-display area in the same configuration as the pad portion and in opposition to the pad portion.

7 Claims, 4 Drawing Sheets

(56) References Cited

U.S. PATENT DOCUMENTS

2008/0117376 A1* 5/2008 Takenaka ................ 349/152
2008/0136323 A1* 6/2008 Park ........................ 313/504
2008/0252447 A1* 10/2008 Atherton et al. .......... 340/540

FOREIGN PATENT DOCUMENTS

| JP | 2005026568 A | 1/2005 |
| TW | 200703435 A | 1/2007 |

* cited by examiner

ORGANIC LIGHT EMITTING DISPLAY DEVICE AND REWORKING METHOD THEREOF

The present application claims priority under 35 U.S.C. §119(a) of Korean Patent Application No. 10-2012-039104 filed on Apr. 16, 2012, which is hereby incorporated by reference in its entirety.

BACKGROUND

1. Field of the Disclosure

The present disclosure relates to an organic light-emitting display device, and more particularly to an organic light-emitting display device possible to reuse an organic light-emitting panel despite the generation of a fault in a driver IC (Integrated Circuit) chip and a bonding defect, and reworking method thereof.

2. Background

Image display devices used for displaying a variety of information on a screen are one of the core technologies of the information and communication era. Such image display devices have been being developed to be thinner, lighter, and more portable, and furthermore to have a high performance Actually, flat panel display devices are spotlighted in the display field due to their reduced weight and volume, well known disadvantages of cathode ray tubes (CRTs). The flat panel display devices include OLED (organic light-emitting display) devices which display images by controlling the light emitting quantity of an organic light emission layer. The OLED devices are self-illuminating display devices employing a thin light emission layer between electrodes. As such, the OLED devices can become thinner like a paper.

The OLED device includes an organic light-emitting panel and a driver circuit for driving the organic light-emitting panel. The driver circuit includes a plurality of driver IC chips. The driver IC chips are electrically connected to the organic light-emitting panel in the state of being loaded on a TCP (Tape Carrier Package) or a base film using one of a TCP bonding method, a COF (Chip-on-Film) bonding method and a TAB (Tape Automated bonding) method. Alternatively, the driver IC chips can be directly mounted on the organic light-emitting panel using a COG (Chip-on-Glass) bonding method.

In order to connect the OLED panel with the driver unit such as a driver IC chip or a TCP, metal wirings used to transfer signals are formed on the OLED panel. Also, a soldering method using a solder and an adhesion method using an anisotropic conductive film (ACF) are used in the connection of the OLED panel and the driver unit.

Recently, the high definition and the enlarged-size of the OLED device force output electrodes of the OLED panel to have a fine pitch. Also, the TAB method and the COG bonding method are most often used in the connection of the OLED panel and the driver unit. As such, the connection method using the ACF becomes gradually important.

A reworking procedure can be performed for the OLED device with the OLED panel and the drive circuit which are connected to each other through an ACF, when a breakdown is caused by any one of a defect of the driver IC chip, a defect of the TCP or COF, or a bonding defect. Such a reworking procedure includes the steps of: sequentially removing the driver IC chip, the TCP or COR and the ACF from the OLED panel; disposing a new ACF on the OLED panel; and attaching a now TCP or COF loaded with a new driver IC chip to the OLED panel through the ACF.

The ACF is disposed on a pad portion of the OLED panel. In detail, the ACF is attached to a buffer layer corresponding to the pad portion.

When the reworking procedure is performed due to the generation of a breakdown caused by any one of a defect of the driver IC chip, a defect of the TCP or COF, or a bonding defect, the ACF attached to the buffer layer can be removed using a chemical solution.

When the ACF is removed using the chemical solution, the buffer layer having a weak adhesive strength is also removed together with the ACF. Due to this, the pad portion of the OLED panel is damaged, and furthermore the OLED device cannot be reused.

BRIEF SUMMARY

Accordingly, the present embodiments are directed to an OLED device and a reworking method thereof that substantially obviate one or more of problems due to the limitations and disadvantages of the related art, and a three dimensional image display device including the same.

One object of the present embodiments is to provide an OLED device with an extra (or a dummy) pad portion that can be reused regardless of whether a pad portion of an OLED panel is damaged by performing a reworking procedure, which attaches a driver IC chip to the extra (or dummy) pad portion, at the generation of a breakdown, as well as a reworking method thereof. According to one general aspect of the present embodiment, an organic light emitting display device includes: an organic light emitting display panel defined into (i) a display area for displaying an image and (ii) a non-display area surrounding the display area; a first chip-on-film loaded with a first driver IC chip, which is configured to drive the organic light emitting display panel, and attached to a pad portion on a first edge of the organic light emitting display panel, wherein the pad portion is formed on the non-display area of the organic light emitting display panel; and a printed circuit board configured to apply signals to the driver IC chip and attached to one edge of the chip-on-film, wherein the organic light emitting display panel includes a first dummy pad portion which is formed on the non-display area in the same configuration as the pad portion and in opposition to the pad portion attached to the first chip-on-film.

A reworking method of an OLED device according to another general aspect of the present embodiment is applied to an OLED device including an OLED panel which includes a pad portion positioned in a non-display area and bonded with a first chip-on-film loaded with a first driver IC chip and a dummy pad portion positioned to face the pad portion and configured the same as the pad portion. The method includes: bonding the first chip-on-film to the pad portion of the organic light emitting display panel; detecting a breakdown which is caused by one of a defect of the first driver IC chip and a bonding defect; removing the first chip-on-film loaded with the first driver IC chip from the pad portion of the organic light emitting display panel when the breakdown is detected; and re-bonding a second chip-on-film loaded with a second driver IC chip to the dummy pad portion of the organic light emitting display panel.

Other systems, methods, features and advantages will be, or will become, apparent to one with skill in the art upon examination of the following figures and detailed description. It is intended that all such additional systems, methods, features and advantages be included within this description, be within the scope of the invention, and be protected by the following claims. Nothing in this section should be taken as a limitation on those claims. Further aspects and advantages are discussed below in conjunction with the embodiments. It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the embodiments and are incorporated in and constitute a part of this application, illustrate embodiment(s) of the invention and together with the description serve to explain the disclosure. In the drawings.

DETAILED DESCRIPTION

Figure 1:
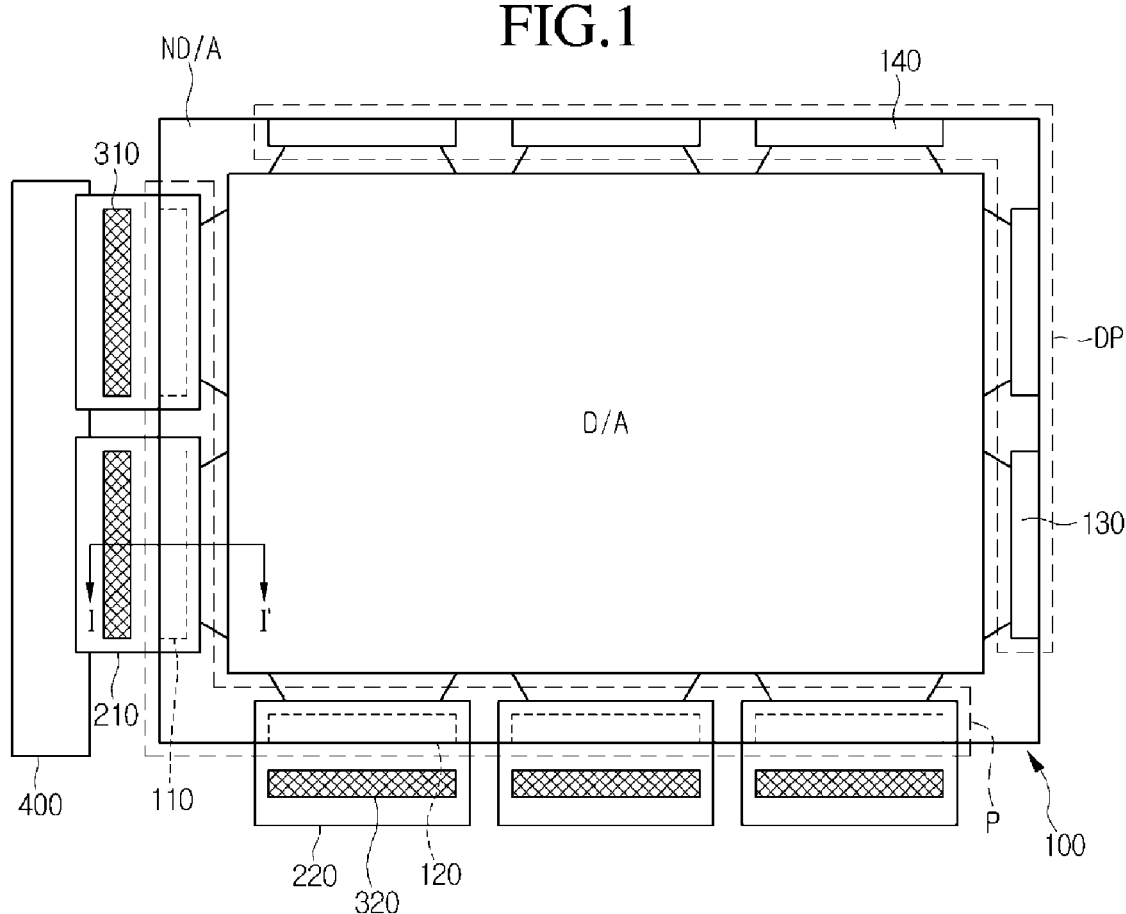
FIG. 1 is a planar view schematically showing an OLED device according to some embodiments of the present disclosure.

Reference will now be made in detail to the embodiments of the present disclosure, examples of which are illustrated in the accompanying drawings. These embodiments introduced hereinafter are provided as examples in order to convey their spirits to the ordinary skilled person in the art. Therefore, these embodiments might be embodied in a different shape, so are not limited to these embodiments described here. Also, the size and thickness of the device might be expressed to be exaggerated for the sake of convenience in the drawings. Wherever possible, the same reference numbers will be used throughout this disclosure including the drawings to refer to the same or like parts.

Figure 2:
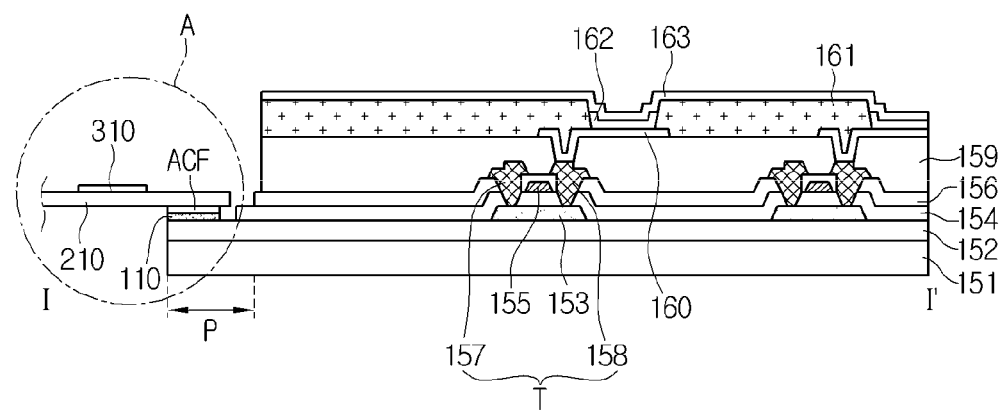
FIG. 2 is a cross-sectional view showing a cross-sectional structure of the OLED device taken along a line I-I' of FIG. 1.

FIG. 1 is a planar view schematically showing an OLED device according to some embodiments of the present disclosure. FIG. 2 is a cross-sectional view showing a cross-sectional structure of the OLED device taken along a line I-I' of FIG. 1.

As shown in FIGS. 1 and 2, the OLED device according to some embodiments of the present disclosure can include an OLED panel 100, a printed circuit board (PCB) 400, and first and second chip-on-films (COFs) 210 and 220 each attached to left and bottom edges of the OLED panel 100. The PCB 400 may be directly bonded to the OLED panel 100 without using the COF as a medium.

The OLED panel 100 may include a substrate 151 in which drive transistors T and organic light emission elements are formed. If the drive transistors T are formed in a top-gate shape, the OLED panel 100 may include a buffer layer 152, a semiconductor layer 153, a gate insulation film 154, gate electrodes 155, an interlayer insulation film 156, source and drain electrodes 157 and 158, and a passivation layer 159, which are sequentially formed on the substrate 151.

The substrate 151 may be formed from a transparent material (e.g. glass, including silicon oxide $SiO_2$ as a principal ingredient). Alternatively, the substrate 151 may be formed from an opaque material, (e.g. a plastic material, a metal or others). The buffer layer 152 may be used to smooth the surface of the substrate 151 and prevent the intrusion of impurities. To this end, the buffer layer 152 may be formed, for example, from one of silicon oxide $SiO_2$, silicon nitride $SiN_x$ and others.

The semiconductor layer 153 may include polysilicon. In this case, the semiconductor layer 153 may be prepared by forming an amorphous silicon layer on the buffer layer 152 and crystallizing the amorphous silicon layer into a polysilicon layer. To the end, a variety of crystallizing methods, including, but not limited to, a RTA (Rapid Thermal Annealing) method, a MILC (Metal Induced lateral Crystallization) method, a SLS (Sequential lateral Solidification) method or others can be used.

The gate insulation film 154 may include an insulation material, including, but not limited to, silicon oxide $SiO_2$, silicon nitride $SiN_x$ or others. Alternatively, the gate insulation film 154 may include an organic insulation material.

The gate electrode 155 may include one of various conductive materials. For example, the gate electrode 155 may include one of Mg, Al, Ni, Cr, Mo, W, MoW, Au and so on.

The interlayer insulation film 156 may include an insulation material, including but not limited to, silicon oxide $SiO_2$, silicon nitride SiNx or others. Alternatively, the interlayer insulation film 156 may include an organic insulation material. Contact holes exposing source and drain regions of the semiconductor layer 153 may be formed by selectively removing the interlayer insulation film 156 and the gate insulation film 154.

The source and drain electrodes 157 and 158 may include the same material as the gate electrode 155 in a single layer structure or in a stack layer structure of at least two layers. In this case, the same material as the gate electrode 155 is deposited on the interlayer insulation film 156 in such a manner as to fill the contact holes before performing a patterning process.

The passivation layer 159 is used to protect the drive transistor T and provide a planarized surface. The passivation layer 159 may be formed in a variety of structures and from one of various materials. For example, the passivation layer 159 may include one of an organic material and an inorganic material. As an example of the organic material, one of BBC (Benzocyclobutene) and acryl may be used. Silicon nitride SiNx may be used as an inorganic material. Also, the passivation layer 159 may be formed in a single layer or a stack layer structure of at least two layers.

The organic light emission element includes a first electrode 160, an organic light emission layer 162 including a light emission layer, and a second electrode 163. The first electrode 160 is formed on the passivation layer 159. The organic light emission layer 162 is formed on the first electrode 160. The second electrode 163 is formed on the organic light emission layer 162.

The organic light emission layer 162 may be configured with a hole relation layer, the light emission layer and an electron relation layer which are sequentially stacked on the first electrode 160. Alternatively, the hole relation layer, the light emission layer and the electron relation layer may be stacked on the first electrode 160 in reversed sequence.

The first electrode 160 is electrically connected to the drain electrode 158 of the drive transistor T through a contact hole which is formed in the passivation layer 159. Such a first electrode 160 may formed from an opaque conductive mater with a high degree of reflexibility (e.g. aluminum).

The organic light emission element may further include a bank insulation film 161 which is formed on the rest of the first electrode 160, excepting a light emission region, and on the exposed passivation layer 150. As such, the bank insulation film 161 may have a bank opening exposing a part of the first electrode 160 opposite to the light emission region.

The second electrode 163 formed on the organic light emission layer 162. Also, the second electrode 163 may be formed from a transparent conductive material (e.g. indium-tin-oxide ITO), so that light emitted from the organic light emission layer 162 is output toward the upside of the second electrode 163.

Such an OLED panel 100 may be defined into a display area D/A used to display an image and a non-display area ND/A in which any image is not displayed. A pad portion P is disposed in the non-display area ND/A.

The pad portion P includes a first pad electrode portion 110 disposed on the left edge of the OLED panel 100 and a second pad electrode portion 120 disposed on the bottom edge of the OLED panel 100.

The first pad electrode portion 110 includes a plurality of conductive lines which are used to transfer a variety of signals and voltages applied from the PCB 400 to the display area D/A. The second pad electrode portion 120 is configured with a plurality of conductive lines which are used to transfer the various signals and voltages applied from the first pad electrode portion 110 to the display area D/A.

The first COFs 210 loaded with the first driver IC chips 310 may be attached to the first pad electrode portion 110 of the OLED panel 100. The first driver IC chips 310 apply drive signals to the display area D/A according to a control signal of a timing controller (not shown).

Such first COFs 210 are attached to the left side of the pad portion P of the OLED panel 100 and one edge of the PCB 400. In detail, the first COFs 210 are attached to the buffer layer 152 of the pad portion P of the OLED panel 100 by means of anisotropic conductive films (ACFs). The first COFs 210 may be attached to the gate insulation film 154 of the pad portion P of the OLED panel 100 by means of anisotropic conductive films (ACFs). The first COFs 210 may be attached to the interlayer insulation film 156 of the pad portion P of the OLED panel 100 by means of anisotropic conductive films (ACFs).

The second COFs 220, to which second driver IC chips 320 are each attached, may be bonded to the second pad electrode portion 120 of the OLED panel 100. The first driver IC chips 310 apply drive signals to the display area D/A according to the control signal transmitted from the timing controller applied from the through one of the first COFs 210.

Such second COFs 220 are attached to the bottom side of the pad portion P of the OLED panel 100. In other words, the second COFs 220 are attached to the buffer layer 152 of the pad portion P of the OLED device 100 by means of the ACFs.

The OLED panel 100 may further include an extra pad portion (or a dummy pad portion) DP facing the pad portion P.

The extra pad portion (or dummy pad portion) DP includes third and fourth pad electrode portions 130 and 140 each having a plurality of conductive lines. The third pad electrode portion 130 is opposite to the first pad electrode portion 110, the fourth pad electrode portion 140 is opposite to the second pad electrode portion 120.

The third pad electrode portion 130 may have the same configuration as the first pad electrode portion 110 of the pad portion P. The fourth pad electrode portion 140 also may have the same configuration as the second pad electrode portion 120 of the pad portion P.

The PCB 400 includes the timing controller, and a power supplier and so on. Also, the PCB 400 further includes a bonding portion which will be connected to the OLED panel 100. The bonding portion of the PCB 400 includes a plurality of bonding pads which will be connected to the first driver IC chips 310. The plurality of bonding pads are opposite to the pad portion of the OLED panel 100.

The OLED device with the above-mentioned configuration may be tested through an inspection process, in order to determine whether or not a breakdown is generated due to a defect of one of the first and second driver IC chips 310 and 320 and a bonding defect.

If the breakdown is generated due to the defect of one of the first and second driver IC chips 310 and 320 or the bonding defect, a rework procedure is performed for the OLED device. The rework procedure may be performed by removing the first and second COFs 210 and 220 from the pad portion P and then attaching new COFs each loaded with the driver IC chip to the extra pad portion (or the dummy pad portion) DP using ACFs.

When the first and second COFs 210 and 220 attached to the pad portion P are removed, the ACFs may also be removed by a chemical agent, such as a solvent.

Figure 3A:
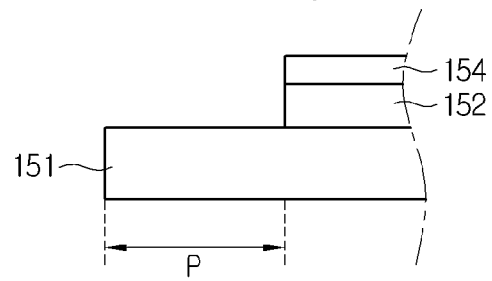
FIGS. 3A and 3B are cross-sectional views showing the status that a first chip-on-film is removed from a pad portion of FIG. 2.
Figure 3B:
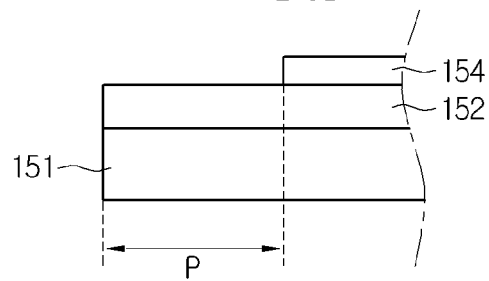

The buffer layer 152, to which the ACFs are attached, has a weak adhesive strength. As such, the buffer layer 152 may also be removed when the ACFs are removed from the OLED panel 100, as shown in FIG. 3A. In accordance therewith, the surface of the substrate 151 corresponding to the pad portion P is exposed, and furthermore the pad portion P of the OLED panel 100 cannot be reused. In some embodiments, the buffer layer 152 may not be removed, and the surface of the buffer layer 152 corresponding to the pad portion P is exposed by removing a gate insulation film 154 as shown in FIG. 3B.

To address this matter, the rework procedure using the extra pad (or the dummy pad portion) DP may be performed. In other words, if the defect of one of the first and second driver IC chips 310 and 320 or the bonding defect is generated, the first and second COFs 210 and 220 attached to the pad portion P may be removed and new COFs are attached to the extra pad portion (or the dummy pad portion) DP, regardless of whether or not the pad portion P is damaged. Therefore, the OLED panel 100 may be reused.

Figure 4:
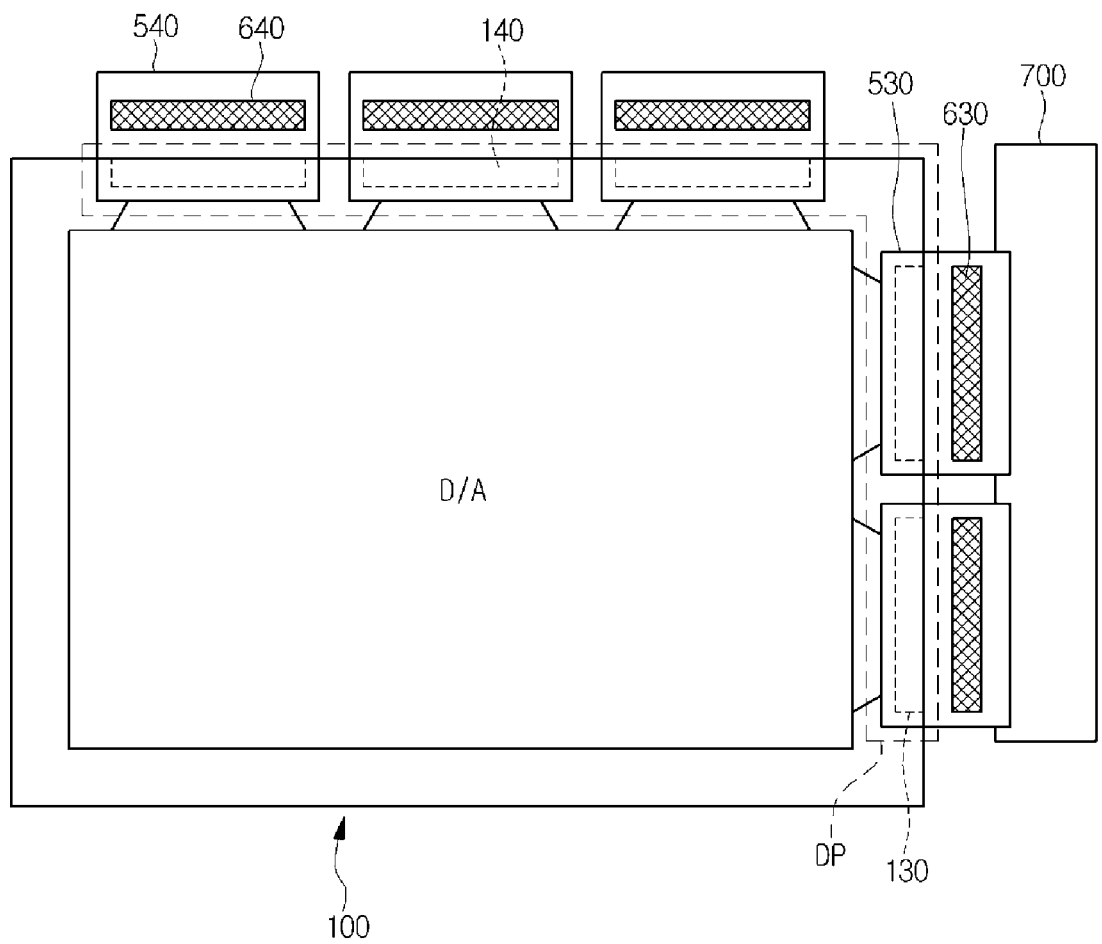
FIG. 4 is a planar view schematically showing a state of the exemplary OLED device after performing a rework procedure.

FIG. 4 is a planar view schematically showing a state of the OLED device after performing a rework procedure.

As shown in FIG. 4, the OLED device of after the rework procedure may include third and fourth COFs 530 and 540 attached to the extra pad portion (or the dummy pad portion) DP of the OLED panel 100.

Third driver IC chips 630 are bonded to the third pad electrode portion 130 of the OLED panel 100 in such a manner as to be attached to the respective third COFs 530. Also, the third driver IC chips 630 reply to the control signals from the timing controller loaded on a PCB 700 and apply the drive signals to the display area D/A.

The third COFs 530 are attached to the right side of the extra pad portion (or the dummy pad portion) DP of the OLED panel 100 and one edge of the PCB 700.

Fourth driver IC chips 640 are bonded to the fourth pad electrode portion 140 of the OLED panel 100 in such a manner as to be attached to the respective fourth COFs 540. Also, the fourth driver IC chips 640 may reply to the control signals transferred to the fourth COFs 540 through one of the third COFs 530 and may apply the drive signals to the display area D/A.

Figure 5:
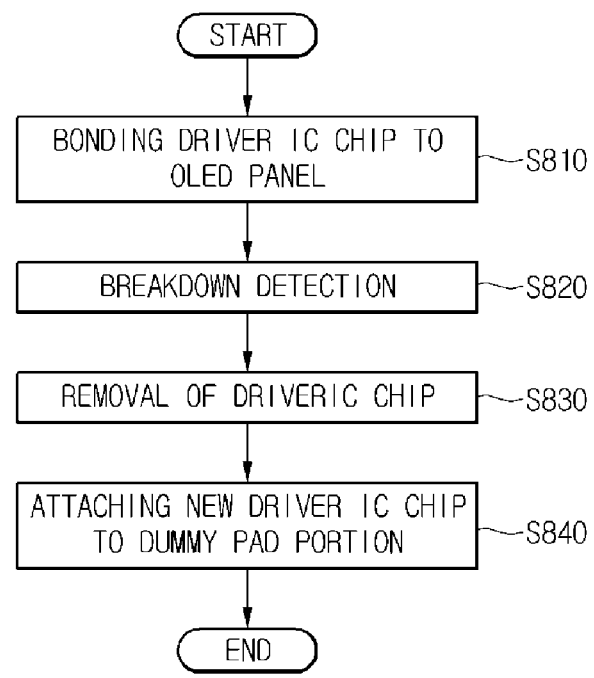
FIG. 5 is a flow chart illustrating a reworking procedure of the OLED device according to some embodiments of the present disclosure.

FIG. 5 is a flow chart illustrating a reworking procedure of the OLED device according to some embodiments of the present disclosure.

As shown in FIG. 5, a rework procedure of the OLED device according to an embodiment of the present disclosure includes: bonding driver IC chips to a pad portion of an OLED panel (S810), determining whether or not a breakdown is generated due to a defect of any driver IC chip or a bonding defect (S820), removing the driver IC chips at the detection of the breakdown (S830), and attaching new driver IC chips to an extra pad portion (or a dummy pad portion) of the OLED panel (S840).

In some embodiments, the driver IC chips are bonded to the OLED panel by means of ACFs in such a manner as to be attached to respective COFs (S810). At this time, the COFs each loaded with the driver IC chip may be bonded to the pad portion of the OLED panel.

Subsequently, the OLED device is inspected to determine whether or not driving errors are generated due to a defect of any driver IC chip or a bonding defect (S820).

If a breakdown of the OLED device is detected through the inspection, the driver IC chips are removed from the OLED panel (S830). When the driver IC chips are removed, the ACFs may also be removed from the OLED panel.

New COFs each loaded with a new driver IC chip are prepared and bonded to the extra pad portion (or the dummy pad portion) DP opposite to the pad portion of the OLED panel (S840). At this time, ACFs may be used for attaching the new COFs to the extra pad portion (or the dummy pad portion) DP of the OLED panel.

As described above, the OLED device and the rework method thereof according to embodiments of the present disclosure enables the COFs attached to the pad portion to be removed and new COFs to be attached to the extra pad portion (or the dummy pad portion) opposite to the pad portion. Therefore, the OLED device may be reused.

It should be understood that numerous other modifications and embodiments may be devised by those skilled in the art that will fall within the spirit and scope of the principles of this disclosure. In other words, although embodiments have been described with reference to a number of illustrative embodiments thereof, this disclosure is not limited to those. Accordingly, the scope of the present disclosure shall be determined only by the appended claims and their equivalents. In addition, variations and modifications in the component parts and/or arrangements, alternative uses must be regarded as included in the appended claims.

What is claimed is:

1. An organic light emitting display device, comprising:
   an organic light emitting display panel defined into a display area for displaying an image and a non-display area surrounding the display area;
   a first chip-on-film loaded with a first driver IC chip, which is configured to drive the organic light emitting display panel, and attached to a first pad on a first edge of the organic light emitting display panel, wherein the first pad is on the non-display area of the organic light emitting display panel connected to first conductive lines configured to supply drive signals to the organic light emitting display panel; and
   a printed circuit board configured to apply signals to the driver IC chip and attached to one edge of the chip-on-film,
   wherein the organic light emitting display panel includes a first extra pad which is formed on the non-display area connected to first extra conductive lines in the same configuration as the first conductive lines of the first pad, and
   wherein the first extra pad is disposed on an edge of the organic light emitting display panel opposite to the first edge having to the first edge having the first pad.

2. The organic light emitting display device according to claim 1, wherein the first pad includes a first pad electrode attached to the first chip-on-film.

3. The organic light emitting display device according to claim 1, wherein the first chip-on-film is attached to the first pad by an anisotropic conductive film.

4. The organic light emitting display device according to claim 1, further comprising a second chip-on-film loaded with a second driver IC chip, which is attached to a second pad on a second edge adjacent to the first edge connected to second conductive lines configured to supply drive signals to the organic light emitting display panel.

5. The organic light emitting display device according to claim 4, wherein the organic light emitting display panel further includes a second extra pad connected to second extra conductive lines in the same configuration as the second conductive lines, and
   wherein the second pad is disposed on an edge of the organic light emitting display panel opposite to the second edge to the second pad.

6. The organic light emitting display device according to claim 4, wherein the second chip-on-film is attached to the pad by an anisotropic conductive film.

7. The organic light emitting display device according to claim 1, wherein the printed circuit board includes a plurality of bonding pads.

* * * * *